US00RE35420E

United States Patent [19]

Cathey et al.

[11] E Patent Number: Re. 35,420

[45] Reissued Date of Patent: *Jan. 7, 1997

[54] METHOD OF INCREASING CAPACITANCE BY SURFACE ROUGHENING IN SEMICONDUCTOR WAFER PROCESSING

[75] Inventors: David A. Cathey; Mark E. Tuttle; Tyler A. Lowrey, all of Boise, Id.

[73] Assignee: Micron Technology, Inc., Boise, Id.

[ * ] Notice: The portion of the term of this patent subsequent to Apr. 7, 2009, has been disclaimed.

[21] Appl. No.: 491,627

[22] Filed: Jun. 19, 1995

Related U.S. Patent Documents

Reissue of:

[64] Patent No.: 5,244,842
Issued: Sep. 14, 1993
Appl. No.: 812,061
Filed: Dec. 17, 1991

U.S. Applications:

[63] Continuation-in-part of Ser. No. 653,839, Feb. 11, 1991, Pat. No. 5,102,832, and Ser. No. 683,215, Apr. 10, 1991, Pat. No. 5,112,773.

[51] Int. Cl.[6] ..... H01C 21/28

[52] U.S. Cl. ..... 437/228; 437/233; 437/919; 437/977; 437/52; 437/60

[58] Field of Search ..... 156/643.1, 644.1, 156/646.1, 657.1, 659.1; 148/DIG. 14, DIG. 138; 437/225, 228, 233, 235, 238, 241, 919, 977, 60

[56] References Cited

U.S. PATENT DOCUMENTS

| | | |
|---|---|---|
| 5,017,505 | 5/1991 | Fujii et al. . |
| 5,037,773 | 8/1991 | Lee et al. . |
| 5,068,199 | 11/1991 | Sandhu . |
| 5,082,797 | 1/1992 | Chan et al. . |
| 5,102,832 | 4/1992 | Tuttle . |
| 5,112,773 | 5/1992 | Tuttle . |
| 5,134,086 | 7/1992 | Ahn . |
| 5,149,676 | 9/1992 | Kim et al. . |

FOREIGN PATENT DOCUMENTS

| | | |
|---|---|---|
| 59-123279 | 7/1984 | Japan . |
| 1-187847 | 7/1989 | Japan . |

*Primary Examiner*—George Fourson
*Attorney, Agent, or Firm*—Wells, St. John, Roberts, Gregory & Matkin, P.S.

[57] ABSTRACT

A method of increasing capacitance by surface roughening in semiconductor wafer processing includes the following steps: a) applying a first layer of material atop a substrate thereby defining an exposed surface; b) incontinuously adhering discrete solid particles to the first layer exposed surface to roughen the exposed surface; and c) applying a second layer of material atop the first layer and adhered solid particles to define an outer surface, the particles adhered to the first layer reducing roughness into the outer surface thereby increasing its surface area and accordingly capacitance of the second layer in the final wafer structure.

37 Claims, 3 Drawing Sheets

METHOD OF INCREASING CAPACITANCE BY SURFACE ROUGHENING IN SEMICONDUCTOR WAFER PROCESSING

Matter enclosed in heavy brackets [ ] appears in the original patent but forms no part of this reissue specification; matter printed in italics indicates the additions made by reissue.

*RELATED PATENT DATA*

*This patent resulted from a continuation-in-part application of both U.S. application Ser. No. 07/653,839, filed on Feb. 11, 1991, which issued as U.S. Pat. No. 5,102,832 on Apr. 7, 1992, and U.S. patent application Ser. No. 07/683,215, filed Apr. 10, 1991, which issued as U.S. Pat. No. 5,112,773 on May 12, 1992.*

TECHNICAL FIELD

This invention relates generally to roughening a surface to maximize its surface area, and thereby increase available capacitance.

BACKGROUND OF THE INVENTION

As device dimensions continue to shrink in semiconductor processing, such as in the increased density of DRAMs, there is a continuing challenge to maintain desired high storage capacitance despite decreasing device size. A principal way of increasing device density is through construction techniques which include three dimensional capacitors such as trenched or stacked capacitors. It is as well recognized that capacitance can be increased by surface roughening of capacitor plates.

This invention comprises an improved technique for roughening a surface to maximize its surface area thereby increasing the capacitance which is available.

BRIEF DESCRIPTION OF THE DRAWINGS

Preferred embodiments of the invention are described below with reference to the accompanying drawings.

DETAILED DESCRIPTION OF PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of increasing capacitance by surface roughening in semiconductor wafer processing comprises:

applying a first layer of material atop a substrate thereby defining an exposed surface;

incontinuously adhering discrete solid particles to the first layer exposed surface to roughen the exposed surface; and applying a second layer of material atop the first layer and adhered solid particles to define an outer surface, the particles adhered to the first layer including roughness into the outer surface thereby increasing its surface area and accordingly capacitance of the second layer.

In accordance with another aspect of the invention, a method of forming a capacitor in semiconductor wafer processing comprises:

providing a layer of insulating dielectric atop a partially processed semiconductor wafer;

etching a contact opening in the dielectric layer which aligns with an active area beneath the dielectric layer;

applying a first layer of polysilicon to a thickness of from about 300 to about 2,000 Angstroms atop the etched dielectric layer thereby defining an exposed surface of polysilicon, the polysilicon making contact with the active area;

incontinuously adhering discrete solid particles to the polysilicon exposed surface to roughen the exposed surface;

applying a second layer of polysilicon to a thickness of from about 300 Angstroms to about 2,000 Angstroms atop the first polysilicon layer and adhered solid particles to provide a lower capacitor plate having an outer surface, the particles adhered to the first polysilicon layer inducing roughness into the outer surface thereby increasing its surface area and the resultant capacitance;

applying a layer of capacitor dielectric atop the outer surface, the roughness of the outer surface at least in part being transferred to the capacitor dielectric layer; and applying a third layer of polysilicon atop the capacitor dielectric layer, the roughness of the capacitor dielectric layer at least in part being transferred to the third layer of polysilicon.

In accordance with yet another aspect of the invention, a method of increasing capacitance by surface roughening in semiconductor wafer processing comprises the following steps:

applying a first layer of material atop a substrate thereby defining an exposed surface;

incontinuously adhering discrete solid particles to the first layer exposed surface;

etching the first layer having adhered particles with an etch chemistry that etches the first layer material but is selective to the particles to etch into and roughen exposed first layer area not covered by particles.

Figure 1:
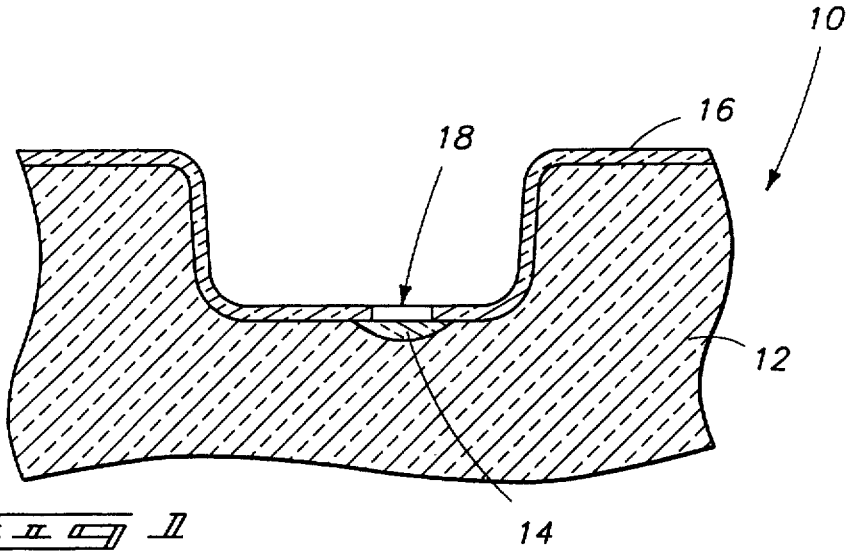
FIG. 1 is a diagrammatic sectional view of a wafer fragment at a processing step in accordance with the invention.

FIG. 1 depicts a semiconductor wafer or substrate 10. The discussion proceeds with methods of increasing capacitance between layers and formation of a capacitor with respect to water 10. Such includes a bulk substrate region 12 having an active area 14 formed therein. An insulating dielectric layer 16 has been applied atop bulk substrate 12, and a contact opening 18 etched therein to provide an access opening to active area 14. A capacitor structure will be generated atop dielectric layer 16, with a lower capacitor plate making contact through opening 18 to active area 14.

Figure 2:
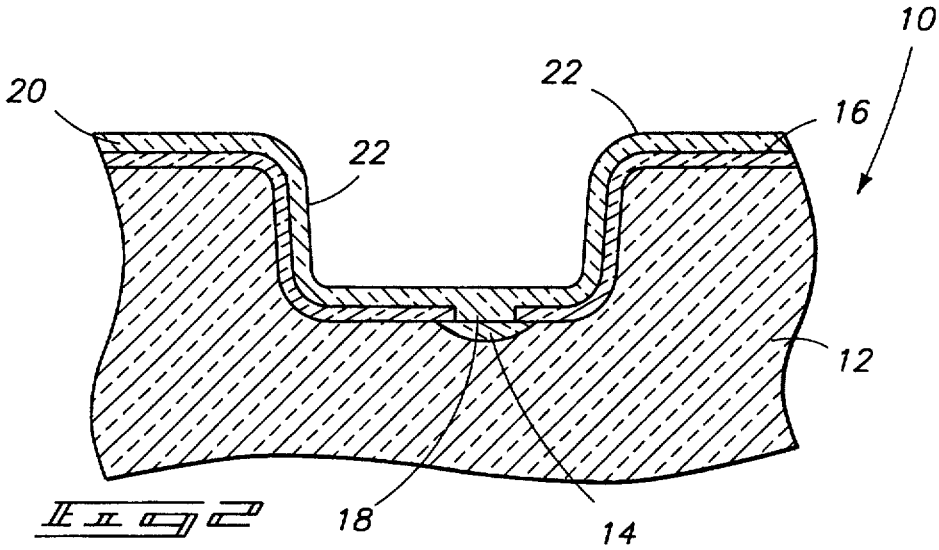
FIG. 2 is a diagrammatic sectional view of the FIG. 1 wafer illustrated at a processing step subsequent to that illustrated by FIG. 1.

Referring to FIG. 2, a first layer of material 20 is applied atop etched dielectric layer 16 thereby defining an upper exposed surface 22. Preferably, first layer of material 20 is polysilicon applied to a thickness of from about 300 Angstroms to 2,000 Angstroms, with 1,000 Angstroms being typical. Polysilicon layer 20 makes contact with active area 14 through contact opening 18.

Figure 3:
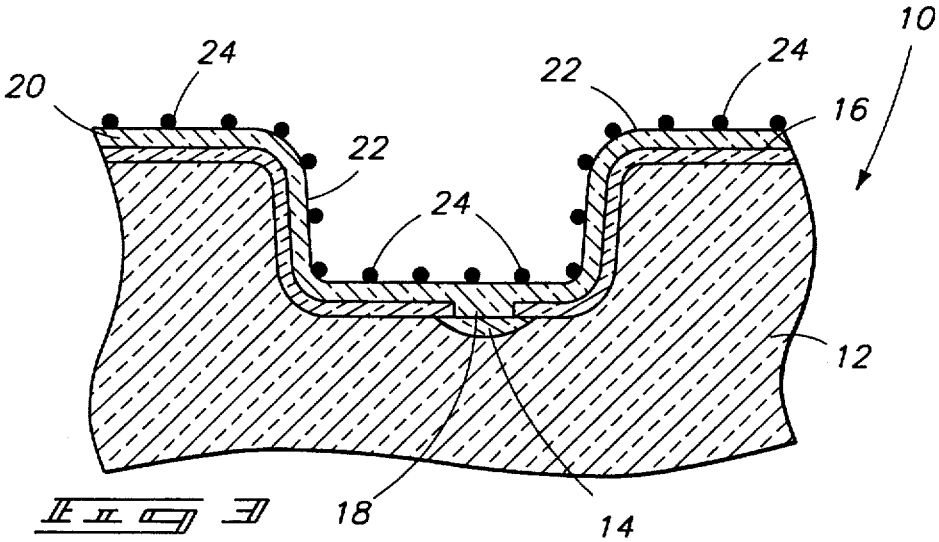
FIG. 3 is a diagrammatic sectional view of the FIG. 1 wafer illustrated at a processing step subsequent to that illustrated by FIG. 2.

Referring to FIG. 3, discrete solid particles 24 are incontinuously adhered to first layer 20 exposed surface 22, which effectively produces irregularities in upwardly exposed surface 22 thereby rendering it rougher than it was before particles 24 were applied. Particles 24 thereby become a part of exposed surface 22. Particles 24 are applied in such a manner that they do not provide a continuous layer of material atop first poly layer 20, but rather result in an incontinuous application which produces discrete solid particles (either isolated or in groups) to induce a roughened effect onto exposed surface 22. Particles 24 preferably have an average diameter ranging from about 30 Angstroms to about 3,000 Angstroms, with 90 Angstroms being typical. The particle material should be selected or provided in such that particles 24 physically adhere to first layer 20. By way of example only, such particle material includes $SiO_2$ and $Al_2O_3$.

The preferred method of application comprises a slurry dip. Substrate 10 is dipped into a slurry of a solution containing the suspended solid particles. The time period within which the wafer is in contact with the slurry is not expected to be very long. Expected residence times are from five seconds to five minutes. The substrate is removed from the slurry with the discrete solid particles 24 adhering to layer 20. Remaining solution of the wafer after removal would be rinsed from the wafer, leaving particles 24 adhering thereto. Where oxide may have formed atop polysilicon layer 20 prior to particle application, preferably such oxide is removed by an HF dip or other method as will be recognized by those people with skill in the art.

The invention was reduced to practice using a standard colloidal silica slurry used in chemical mechanical polishing techniques (CMP). The particular slurry used was 6 parts water, 1 part Cab-o-Sperse™ colloidal silicon, Grade SC-1 by Rippey Corp., 5080 Robert J. Mathews Parkway, Elderado Hills, Calif. Such is supplied to end-users at a pH of 10 to 12, and includes suspended glass $SiO_2$ having an average or typical diameter of about 90 Angstroms. A dip in such slurry of less than five seconds adhered the $SiO_2$ particles of the slurry to the polysilicon surface. Upon removal of the wafer, it was rinsed and dried with particles 24 still adhering to the wafer surface. The adherence of the $SiO_2$ particles is understood to result from chemical interaction with the surface due to van der Waals forces and dangling or available silicon bonding sites at the edge of the polycrystalline silicon structure that adhere to the $SiO_2$. Materials other than polysilicon and $SiO_2$ particles could of course be utilized in the context of the invention.

Figure 4:
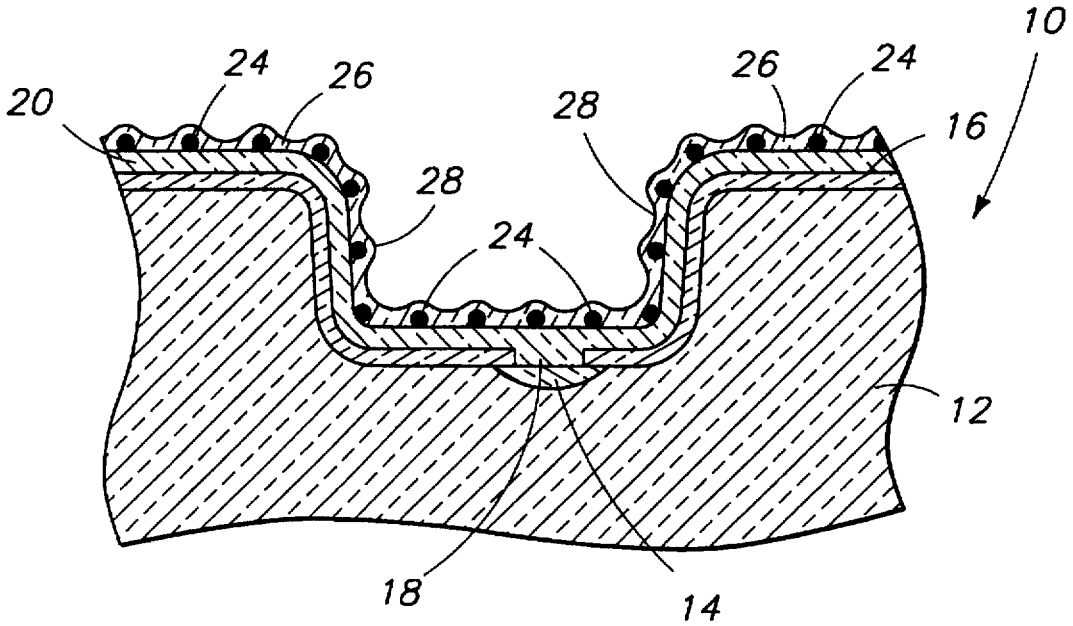
FIG. 4 is a diagrammatic sectional view of the FIG. 1 wafer illustrated at a processing step subsequent to that illustrated by FIG. 3.

Referring to FIG. 4, a second layer 26 of polysilicon or other material is applied atop first layer 20 and adhered solid particles 24 thereby defining an outer surface 28. Second layer 26 is preferably applied to a thickness of from about 100 Angstroms to about 2,000 Angstroms, with 500 Angstroms being typical. Particles 24 adhering to first layer 20 induce roughness into outer surface 28 thereby increasing the surface area of outer surface 28 than were particles 24 not present, and accordingly increasing the capacitance of the final structure. In the described embodiment, the composite or combination of layers 20 and 26 which include particles 24 will become a lower capacitor plate.

Figure 5:
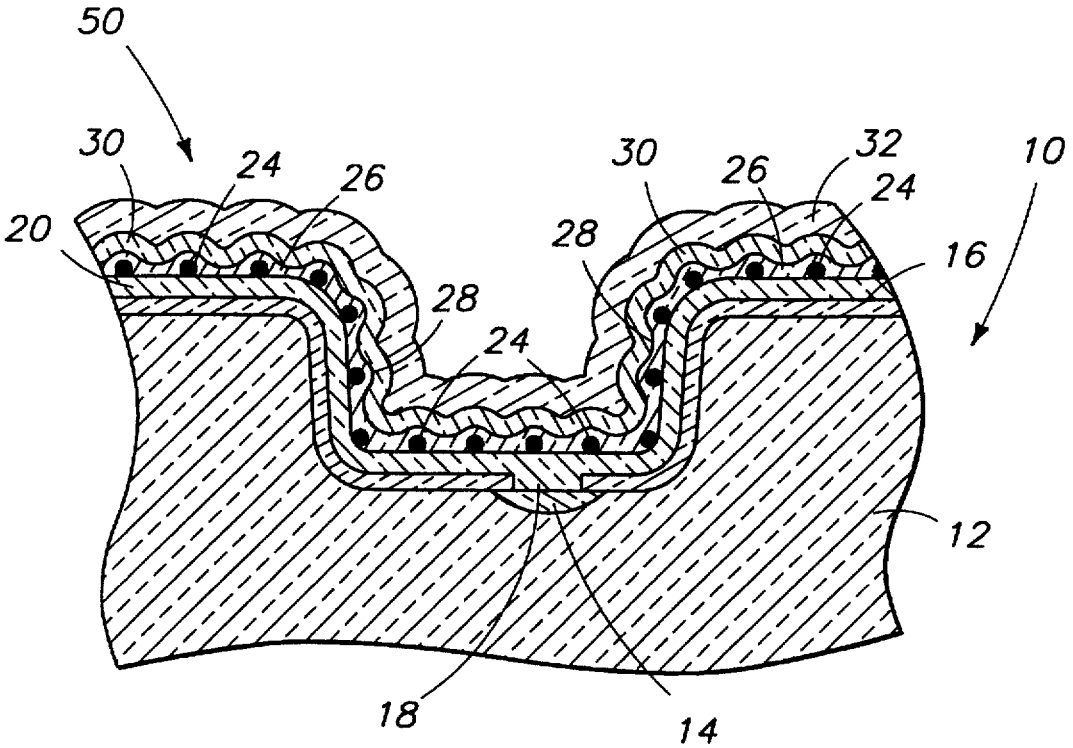
FIG. 5 is a diagrammatic sectional view of the FIG. 1 wafer illustrated at a processing step subsequent to that illustrated by FIG. 4.

Referring to FIG. 5, a capacitor dielectric layer 30, such as 100 Angstroms $Si_3N_4$ and 20 Angstroms $SiO_2$; 100 Angstroms $SiO_2$ and 20 Angstroms $Ta_2O_5$; 100 Angstroms $Si_3N_4$ and 20 Angstroms $Ta_2O_5$; $Ta_2O_5$ or $SiO_2$ or $Si_3N_4$, is applied atop outer surface 28. The roughness of outer surface 28 transfers at least in part to the capacitor dielectric layer roughening its upper surface. Thereafter, a third layer 32 of polysilicon or other material is applied atop capacitor dielectric layer 30, with the roughness of capacitor dielectric layer 30 at least in part being transferred to third layer 32. This thereby defines a capacitor structure 50. The significant area for roughening and capacitance increase occurs at the interfaces of layers 32 and 26 with the capacitor dielectric 30.

Layers 20 and 26 could be separately patterned to define an outline of a lower capacitor plate either individually or at the conclusion of application of layer 26. Alternatively, but less preferred, patterning might not be conducted until after formation of the construction illustrated by FIG. 5. Further, layers 20 and 26 could be conductively doped in situ during their respective applications, or subsequent to their application. Additionally, poly layer 20 could be patterned before or after slurry treatment. Alternate slurries, such as an aluminum oxide or silicon slurry, could of course also be used.

Figure 6:
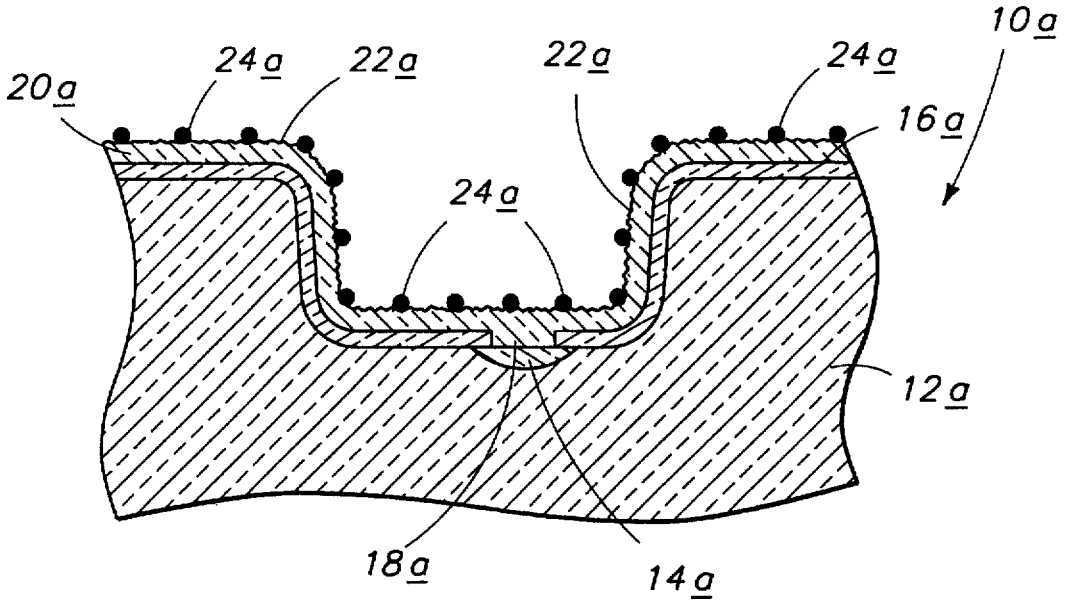
FIG. 6 is a diagrammatic sectional view of an alternate wafer depicting an alternate processing step in accordance with the invention.

Additional methods in the context of the invention could also be used to further roughen the surface area and thereby increase capacitance. One of such methods concerns the slurry step of application of particles 24. The slurry solution could be selected or comprise a chemistry that chemically etches the exposed first layer material 20 during the slurry dip process. With respect to polysilicon, it is anticipated that the CMP colloidal silicon slurry at a pH of between 11 and 14, with 12 being preferred, could be utilized to further roughen poly layer 20 during the particle adhering step without appreciably removing layer 20 from the substrate. By increasing, monitoring and controlling the residence time during the dip as would be readily determined by a person of skill in the art, the outer surface of poly 20 would be roughened as diagrammatically illustrated by FIG. 6. (Like components between the various embodiments of the disclosure utilize the same numbers, with the suffixes "a" and "b" being utilized to designate the different alternate embodiments.) In FIG. 6, wafer 10a is illustrated as having a poly layer 20a and particles 24a applied thereto. Upper surface 22a is illustrated as being roughened more than the FIGS. 1–5 embodiment due to etching of layer 20a during the slurry dip process. Such additional roughening of surface 22a will transfer at least in part to the subsequent dielectric layer and upper capacitor plate layer (not shown), thereby increasing available capacitance further.

Figure 7:
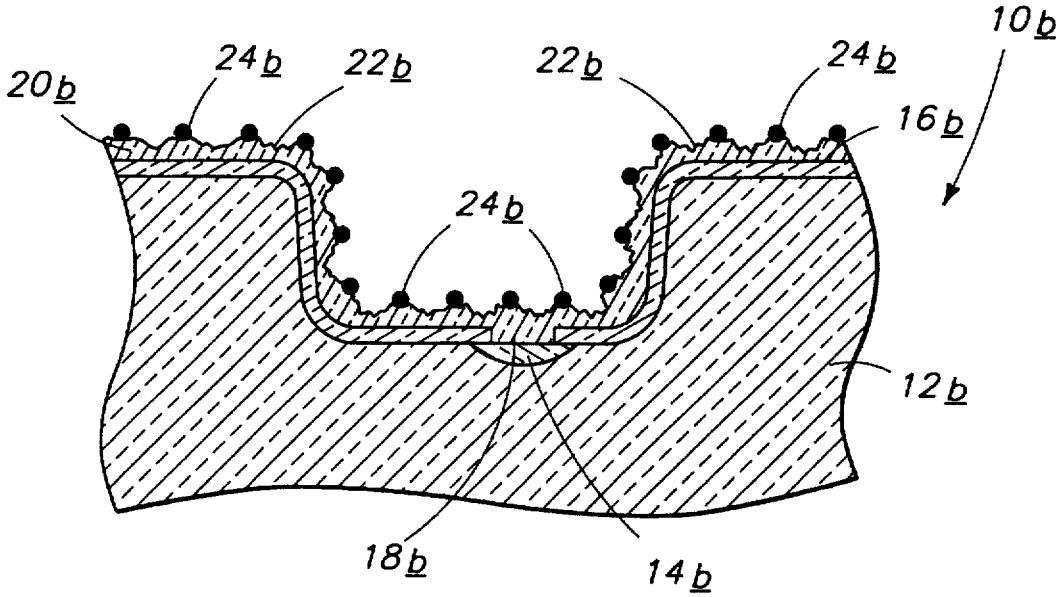
FIG. 7 is a diagrammatic sectional view of a wafer fragment illustrating still another alternate processing step in accordance with the invention.

In an alternate method of added roughening, the method would further comprise etching first layer 20 having particles 24 adhered thereto with an etch chemistry that etches first layer material but is selective to the material of particles 24. This will thereby further roughen exposed first layer area 22 not covered by particles 24. Such is diagrammatically illustrated in FIG. 7. The upper surface area 22b between particles 24b is indicated as being etched to further increase the roughness of applied layer 20b. The degree of etching is illustrated as being greater in degree or severity than that illustrated by the FIG. 6 method, thereby further increasing available capacitance. An example etch chemistry and method which would etch the polysilicon and not the $SiO_2$ particles of the example would include chlorine containing plasma, a high pH aqueous solution such as KOH or ammonium hydroxide, or a mixture containing nitric acid, acetic acid, water and hydrofluoric acid. The methods depicted by FIGS. 6 and 7 could be combined, thereby further enhancing surface roughening.

In yet another aspect of the invention the wafer could be processed as generally described above, except that particles 24a or 24b are removed prior to deposition of the dielectric layer. With respect to the example of FIG. 6, a slurry solution containing particles 24a which will etch material 20a will roughen surface 22a to a greater degree than were particles 24a not in the slurry solution. Upon adhering of particles 24a to material 20a, the slurry will continue to etch exposed material 20a which is not covered by adhered particles 24a. Such will produce higher peaks and lower valleys than were the particles not present in the slurry. With respect to the example of FIG. 7, a subsequent etch (after particle 24a adherence) which is selective to the particles will likewise produce higher peaks and lower valleys than were the particles not adhered to material 20a during the etch. The particles 24a or 24b could then be removed leaving a rougher surface than would otherwise have been obtained were the particles not present earlier in the process. Where the particles are $SiO_2$ or $Al_2O_3$, an HF dip would be an example of a method which would remove the particles without disrupting first layer material 20, 20a, or 20b. Thereafter, a capacitor dielectric layer would be applied, followed by the other capacitor plate material.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of increasing capacitance by surface roughening in semiconductor wafer processing comprising the following steps:

applying a first layer of material atop a substrate thereby defining an exposed surface;

incontinuously adhering discrete solid particles to the first layer exposed surface to roughen the exposed surface; and applying a second layer of material atop the first layer and the adhered discrete solid particles to define an outer surface, the discrete solid particles adhered to the first layer inducing roughness into the outer surface thereby increasing its surface area and accordingly capacitance of the second layer in a final wafer structure.

2. The method of increasing capacitance by surface roughening of claim 1 wherein the discrete solid particles have an average diameter ranging from 30 Angstroms to 3,000 Angstroms.

3. The method of increasing capacitance by surface roughening of claim 1 wherein the discrete solid particles are of a material selected from the group consisting of $SiO_2$ and $Al_2O_3$.

4. The method of increasing capacitance by surface roughening of claim 1 wherein, the discrete solid particles have an average diameter ranging from 30 Angstroms to 3,000 Angstroms; and the discrete solid particles are of a material selected from the group consisting of $SiO_2$ and $Al_2O_3$.

5. The method of increasing capacitance by surface roughening of claim 1 further comprising etching the first layer having the adhered discrete solid particles with an etch chemistry that etches the first layer material but is selective to the adhered discrete solid particles to roughen the exposed first layer area not covered by the adhered discrete solid particles.

6. The method of increasing capacitance by surface roughening of claim 5 wherein the discrete solid particles have an average diameter ranging from 30 Angstroms to 3,000 Angstroms.

7. The method of increasing capacitance by surface roughening of claim 5 wherein the discrete solid particles are of a material selected from the group consisting of $SiO_2$ and $Al_2O_3$.

8. The method of increasing capacitance by surface roughening of claim 1 wherein the step of adhering the discrete solid particles comprises dipping the substrate into a slurry of a solution containing the discrete solid particles suspended therein, removing the substrate from the slurry with the discrete solid particles adhering to the first layer, and rinsing remaining solution from the wafer.

9. The method of increasing capacitance by surface roughening of claim 8 wherein the discrete solid particles have an average diameter ranging from 30 Angstroms to 3,000 Angstroms.

10. The method of increasing capacitance by surface roughening of claim 8 wherein the discrete solid particles are of a material selected from the group consisting of $SiO_2$ and $Al_2O_3$.

11. The method of increasing capacitance by surface roughening of claim 8 further comprising etching the first layer having the adhered discrete solid particles with an etch chemistry that etches the first layer material but is selective to the adhered discrete solid particles to roughen the exposed first layer area not covered by the adhered discrete solid particles.

12. The method of increasing capacitance by surface roughening of claim 1 wherein, the step of adhering the discrete solid particles comprises dipping the substrate into a slurry of a solution containing the discrete solid particles suspended therein, removing the substrate from the slurry with the discrete solid particles adhering to the first layer, and rinsing remaining solution from the wafer; and the slurry solution being comprised of a chemistry that chemically etches the exposed first layer material during the dipping step to further roughen the exposed surface.

13. The method of increasing capacitance by surface roughening of claim 12 wherein the discrete solid particles have an average diameter ranging from 30 Angstroms to 3,000 Angstroms.

14. The method of increasing capacitance by surface roughening of claim 12 wherein the discrete solid particles are of a material selected from the group consisting of $SiO_2$ and $Al_2O_3$.

15. The method of increasing capacitance by surface roughening of claim 12 further comprising an additional step of etching the first layer having the adhered discrete solid particles with an etch chemistry that etches the first layer material but is selective to the adhered discrete solid particles to roughen the exposed first layer area not covered by the adhered discrete solid particles.

16. The method of increasing capacitance by surface roughening of claim 15 wherein the discrete solid particles have an average diameter ranging from 30 Angstroms to 3,000 Angstroms.

17. The method of increasing capacitance by surface roughening of claim 15 wherein the discrete solid particles are of a material selected from the group consisting of $SiO_2$ and $Al_2O_3$.

18. A method of forming a capacitor in semiconductor wafer processing comprising the following steps:

providing a layer of insulating dielectric atop a partially processed semiconductor wafer;

etching a contact opening in the dielectric layer which aligns with an active area beneath the dielectric layer;

applying a first layer of polysilicon to a thickness of from about 100 to 2,000 Angstroms atop the etched dielectric layer thereby defining an exposed surface of polysilicon, the polysilicon making contact with the active area;

incontinuously adhering discrete solid particles to the polysilicon exposed surface to roughen the exposed surface;

applying a second layer of polysilicon to a thickness of from about 300 to 2000 Angstroms atop the first polysilicon layer and adhered discrete solid particles to provide a lower capacitor plate having an outer surface, the discrete solid particles adhered to the first polysilicon layer inducing roughness into the outer surface thereby increasing its surface area and accordingly capacitance of the lower capacitor plate in a final wafer structure;

applying a layer of capacitor dielectric atop the outer surface, the roughness of the outer surface at least in part being transferred to the capacitor dielectric layer; and applying a third layer of polysilicon atop the capacitor dielectric layer, the roughness of the capacitor dielectric layer at least in part being transferred to the third layer of polysilicon.

19. The method of forming a capacitor of claim 18 wherein the discrete solid particles have an average diameter ranging from 30 Angstroms to 3,000 Angstroms.

20. The method of forming a capacitor of claim 18 wherein the discrete solid particles are of a material selected from the group consisting of $SiO_2$ and $Al_2O_3$.

21. The method of increasing capacitance by surface roughening of claim 18 further comprising etching the first layer having the adhered discrete solid particles with an etch chemistry that etches the first layer material but is selective to the adhered discrete solid particles to roughen the exposed first layer area not covered by the adhered discrete solid particles.

22. The method of forming a capacitor of claim 21 wherein the discrete solid particles have an average diameter ranging from 30 Angstroms to 3,000 Angstroms.

23. The method of forming a capacitor of claim 21 wherein the discrete solid particles are of a material selected from the group consisting of $SiO_2$ and $Al_2O_3$.

24. The method of increasing capacitance by surface roughening of claim 18 wherein the step of adhering the discrete solid particles comprises dipping the substrate into a slurry of a solution containing the discrete solid particles suspended therein, removing the substrate from the slurry with the discrete seolid particles adhering to the first layer, and rinsing remaining solution from the wafer.

25. The method of forming a capacitor of claim 24 wherein the discrete solid particles have an average diameter ranging from 30 Angstroms to 3,000 Angstroms.

26. The method of forming a capacitor of claim 24 wherein the discrete solid particles are of a material selected from the group consisting of $SiO_2$ and $Al_2O_3$.

27. The method of increasing capacitance by surface roughening of claim 24 further comprising etching the first layer having the adhered discrete solid particles with an etch chemistry that etches the first layer material but is selective to the adhered discrete solid particles to roughen the exposed first layer area not covered by the adhered discrete solid particles.

28. The method of forming a capacitor of claim 18 wherein, the step of adhering the discrete solid particles comprises dipping the substrate into a slurry of a solution containing the discrete solid particles suspended therein, removing the substrate from the slurry with the discrete solid particles adhering to the first layer, and rinsing remaining solution from the wafer; and the slurry solution being comprised of a chemistry that chemically etches polysilicon during the dipping step to further roughen the exposed surface.

29. The method of forming a capacitor of claim 28 wherein the discrete solid particles have an average diameter ranging from 30 Angstroms to 3,000 Angstroms.

30. The method of forming a capacitor of claim 28 wherein the discrete solid particles are of a material selected from the group consisting of $SiO_2$ and $Al_2O_3$.

31. The method of increasing capacitance by surface roughening of claim 28 further comprising an additional step of etching the first layer having the adhered discrete solid particles with an etch chemistry that etches the first layer material but is selective to the adhered discrete solid particles to roughen the exposed first layer area not covered by the adhered discrete solid particles.

32. The method of forming a capacitor of claim 31 wherein the discrete solid particles have an average diameter ranging from 30 Angstroms to 3,000 Angstroms.

33. The method of forming a capacitor of claim 31 wherein the discrete solid particles are of a material selected from the group consisting of $SiO_2$ and $Al_2O_3$.

34. A method of increasing capacitance by surface roughening in semiconductor wafer processing comprising the following steps:

applying a first layer of material atop a substrate thereby defining an exposed surface;

incontinuously adhering discrete solid particles to the first layer exposed surface, such step of adhering the discrete solid particles comprising dipping the substrate into a slurry of a solution containing the discrete solid particles suspended therein, removing the substrate from the slurry with the discrete solid particles adhering to the first layer, and rinsing remaining solution from the wafer; and etching the first layer having the adhered discrete solid particles with an etch chemistry that etches the first layer material but is selective to the adhered discrete solid particles to etch into and roughen the exposed first layer area not covered by the adhered discrete solid particles.

35. The method of increasing capacitance by surface roughening of claim 34 whereto the slurry solution is comprised of a chemistry that chemically etches the exposed first layer material during dipping to further roughen the exposed surface.

36. A method of increasing capacitance by surface roughening in semiconductor wafer processing comprising the following steps:

applying a first layer of material atop a substrate thereby defining an exposed surface;

incontinuously adhering discrete solid particles to the first layer exposed surface, such particles comprising $SiO_2$; and etching the first layer having the adhered discrete solid particles with an etch chemistry that etches the first layer material but is selective to the adhered discrete solid particles to etch into and roughen the exposed first layer area not covered by the adhered discrete solid particles.

37. A method of increasing capacitance by surface roughening in semiconductor wafer processing comprising the following steps:

applying a first layer of material atop a substrate thereby defining an exposed surface;

incontinuously adhering discrete solid particles to the first layer exposed surface, such particles comprising $Al_2O_3$; and etching the first layer having the adhered discrete solid particles with an etch chemistry that etches the first layer material but is selective to the adhered discrete solid particles to etch into and roughen the exposed first layer area not covered by the adhered discrete solid particles.

* * * * *